US010002782B2

(12) United States Patent
Kimball et al.

(10) Patent No.: US 10,002,782 B2
(45) Date of Patent: Jun. 19, 2018

(54) ESC ASSEMBLY INCLUDING AN ELECTRICALLY CONDUCTIVE GASKET FOR UNIFORM RF POWER DELIVERY THERETHROUGH

(71) Applicant: Lam Research Corporation, Fremont, CA (US)

(72) Inventors: Christopher Kimball, San Jose, CA (US); Keith Gaff, Alameda, CA (US); Alexander Matyushkin, San Jose, CA (US); Zhigang Chen, III, Campbell, CA (US); Keith Comendant, Fremont, CA (US)

(73) Assignee: LAM RESEARCH CORPORATION, Fremont, CA (US)

( * ) Notice: Subject to any disclaimer, the term of this patent is extended or adjusted under 35 U.S.C. 154(b) by 106 days.

(21) Appl. No.: 14/517,095

(22) Filed: Oct. 17, 2014

(65) Prior Publication Data

US 2016/0111314 A1 Apr. 21, 2016

(51) Int. Cl.

| | |
|---|---|
| ***H01J 37/32*** | (2006.01) |
| ***H01L 21/683*** | (2006.01) |
| ***H01L 21/02*** | (2006.01) |
| ***H01L 21/3065*** | (2006.01) |
| ***H01L 21/285*** | (2006.01) |
| ***H01L 21/67*** | (2006.01) |

(52) U.S. Cl.

CPC .... *H01L 21/6833* (2013.01); *H01J 37/32568* (2013.01); *H01J 37/32715* (2013.01); *H01J 37/32724* (2013.01)

(58) Field of Classification Search

USPC ................. 118/728–733; 156/345.51–345.55

See application file for complete search history.

(56) References Cited

U.S. PATENT DOCUMENTS 5,463,526 A 10/1995 Mundt
5,793,192 A 8/1998 Kubly et al.
5,880,920 A 3/1999 Fischer et al.

(Continued)

OTHER PUBLICATIONS

"Bonding, n.". OED Online. Sep. 2016. Oxford University Press. http://www.oed.com/viewdictionaryentry/Entry/21279 (accessed Sep. 17, 2016).*

*Primary Examiner* — Karla A Moore
*Assistant Examiner* — Tiffany Z Nuckols

(57) ABSTRACT

A substrate processing apparatus for processing substrates comprises a processing chamber in which a substrate is processed. A process gas source is adapted to supply process gas into the processing chamber. A RF energy source is adapted to energize the process gas into a plasma state in the processing chamber. A vacuum source is adapted to exhaust byproducts of the processing from the processing chamber. The processing chamber includes an electrostatic chuck assembly having a layer of ceramic material that includes an upper electrostatic clamping electrode and at least one RF electrode, a temperature controlled RF powered baseplate, and at least one annular electrically conductive gasket extending along an outer portion of an upper surface of the temperature controlled RF powered baseplate. The at least one annular electrically conductive gasket electrically couples the upper surface of the temperature controlled RF powered baseplate to the at least one RF electrode.

35 Claims, 5 Drawing Sheets

(56) References Cited

U.S. PATENT DOCUMENTS 5,880,924 A 3/1999 Kumar et al.
5,923,521 A 7/1999 Burkhart
5,933,314 A 8/1999 Lambson et al.
6,178,919 B1 1/2001 Li et al.
6,238,160 B1 5/2001 Hwang et al.
6,273,958 B2 8/2001 Shamouilian et al.
6,303,879 B1 10/2001 Burkhart
6,310,755 B1 10/2001 Kholodenko et al.
6,483,690 B1 11/2002 Nakajima et al.
6,512,333 B2 1/2003 Chen
6,567,258 B2 5/2003 Sexton et al.
6,639,783 B1 10/2003 Shamouilian et al.
6,645,304 B2 11/2003 Yamaguchi
6,646,233 B2* 11/2003 Kanno ................ H01L 21/6831 118/724
6,649,021 B2 11/2003 Ohmoto et al.
6,665,168 B2 12/2003 Lin
6,670,038 B2 12/2003 Sun et al.
6,678,143 B2 1/2004 Masuda et al.
6,760,213 B2 7/2004 Yamamoto
6,848,690 B1 2/2005 Hunter
6,951,587 B1 10/2005 Narushima
6,972,071 B1* 12/2005 Tyler ................ H01J 37/32357 118/715
7,072,166 B2 7/2006 Qin et al.
7,149,070 B2 12/2006 Breitschwerdt et al.
7,196,896 B2 3/2007 Howald et al.
7,209,339 B2 4/2007 Kitabayashi et al.
7,218,503 B2 5/2007 Howald
7,274,004 B2 9/2007 Benjamin et al.
7,791,857 B2 9/2010 Mizuno et al.
7,821,767 B2 10/2010 Fujii
7,848,077 B2 12/2010 Mizuno et al.
7,869,184 B2 1/2011 Steger
7,892,445 B1 2/2011 Wei et al.
8,060,330 B2 11/2011 O'Neill et al.
8,098,475 B2 1/2012 Sijben
8,139,340 B2 3/2012 Reynolds
8,199,454 B2 6/2012 Koyama et al.
8,270,142 B2 9/2012 Lee et al.
8,390,980 B2 3/2013 Sansoni et al.
8,422,193 B2 4/2013 Tao et al.
8,520,360 B2 8/2013 Singh
8,536,494 B2 9/2013 Benjamin et al.
8,546,732 B2 10/2013 Singh
8,559,159 B2 10/2013 Roy et al.
2004/0168640 A1* 9/2004 Muto ........................ C23C 4/02 118/728
2004/0244688 A1* 12/2004 Himori ............. H01J 37/32082 118/723 E
2005/0042881 A1* 2/2005 Nishimoto .......... H01L 21/6833 438/710
2007/0109714 A1 5/2007 Chung
2008/0017111 A1* 1/2008 Ishisaka ............ H01J 37/32082 118/723 E
2008/0197780 A1* 8/2008 Yamazawa ........ H01J 37/32091 315/111.21
2009/0290145 A1* 11/2009 Howard ............ H01J 37/32642 356/72
2011/0149462 A1* 6/2011 Kugimoto ........... H01L 21/6831 361/234
2013/0088808 A1 4/2013 Parkhe et al.
2013/0088809 A1 4/2013 Parkhe et al.
2013/0100572 A1 4/2013 Shu
2013/0128409 A1 5/2013 Nam et al.
2013/0153147 A1 6/2013 Senzaki et al.
2013/0279066 A1* 10/2013 Lubomirsky ..... H01L 21/67103 361/234
2013/0284709 A1 10/2013 Makhratchev et al.
2013/0286531 A1 10/2013 Shiraiwa et al.
2013/0286533 A1* 10/2013 Takasaki ................ H02N 13/00 361/234
2013/0321974 A1 12/2013 Kuribayashi
2013/0340942 A1 12/2013 Schaefer et al.
2014/0063681 A1 3/2014 Anada et al.
2014/0069585 A1* 3/2014 Aoto ................... H01L 21/6831 156/345.52
2014/0071582 A1 3/2014 Anada et al.
2014/0116622 A1 5/2014 Lee
2014/0159325 A1* 6/2014 Parkhe .............. H01L 21/67109 279/128
2014/0204501 A1 7/2014 Moriya et al.

* cited by examiner

ESC ASSEMBLY INCLUDING AN ELECTRICALLY CONDUCTIVE GASKET FOR UNIFORM RF POWER DELIVERY THERETHROUGH

FIELD OF THE INVENTION

The invention relates to improvements in electrostatic chuck assembly designs and methods of uniformly supplying RF energy to a RF electrode of an electrostatic chuck assembly.

BACKGROUND

Various chucking arrangements have been developed for clamping substrates during processing thereof in vacuum chambers such as plasma etch chambers, plasma enhanced physical vapor deposition chambers, chemical vapor deposition chambers, plasma enhanced chemical vapor deposition chambers, and atomic layer deposition chambers. One challenge has been uniformly delivering RF power to an electrode embedded within a layer of ceramic material of the electrostatic chuck. Thus, there is a need for improved electrostatic chuck designs and methods of supplying RF power to a RF electrode embedded within the electrostatic chuck.

SUMMARY

Disclosed herein is a substrate processing apparatus for processing substrates. The substrate processing apparatus comprises a processing chamber in which a semiconductor substrate is processed, a process gas source which is in fluid communication with the processing chamber and is adapted to supply process gas into the processing chamber, and a RF energy source adapted to energize the process gas into a plasma state in the processing chamber. A vacuum source is adapted to exhaust process gas and byproducts of the processing from the processing chamber. The processing chamber includes an electrostatic chuck assembly comprising a layer of ceramic material including an upper electrostatic clamping (ESC) electrode and at least one RF electrode. The electrostatic chuck assembly also includes a temperature controlled RF powered baseplate, and at least one annular electrically conductive gasket extending along an upper surface of the temperature controlled RF powered baseplate. The at least one annular electrically conductive gasket extends through or around a bond layer, which bonds the temperature controlled RF powered baseplate to the layer of ceramic material, and electrically couples the upper surface of the temperature controlled RF powered baseplate to the at least one RF electrode. The layer of ceramic material includes a support surface adapted to electrostatically clamp a substrate during substrate processing.

Further disclosed herein is a method of making an electrostatic chuck assembly. The method comprises making a layer of ceramic material having an upper electrostatic clamping (ESC) electrode and at least one RF electrode embedded therein by arranging layers of green ceramic material with the upper ESC electrode and the at least one RF electrode therebetween and firing the layers of the green ceramic material to form the layer of ceramic material. The layer of ceramic material is bonded to an upper surface of a temperature controlled RF powered baseplate wherein at least one annular electrically conductive gasket electrically extends through the bond layer and electrically couples the RF powered baseplate to the at least one RF electrode.

BRIEF DESCRIPTION OF THE DRAWING FIGURES

DETAILED DESCRIPTION

Figure 1:
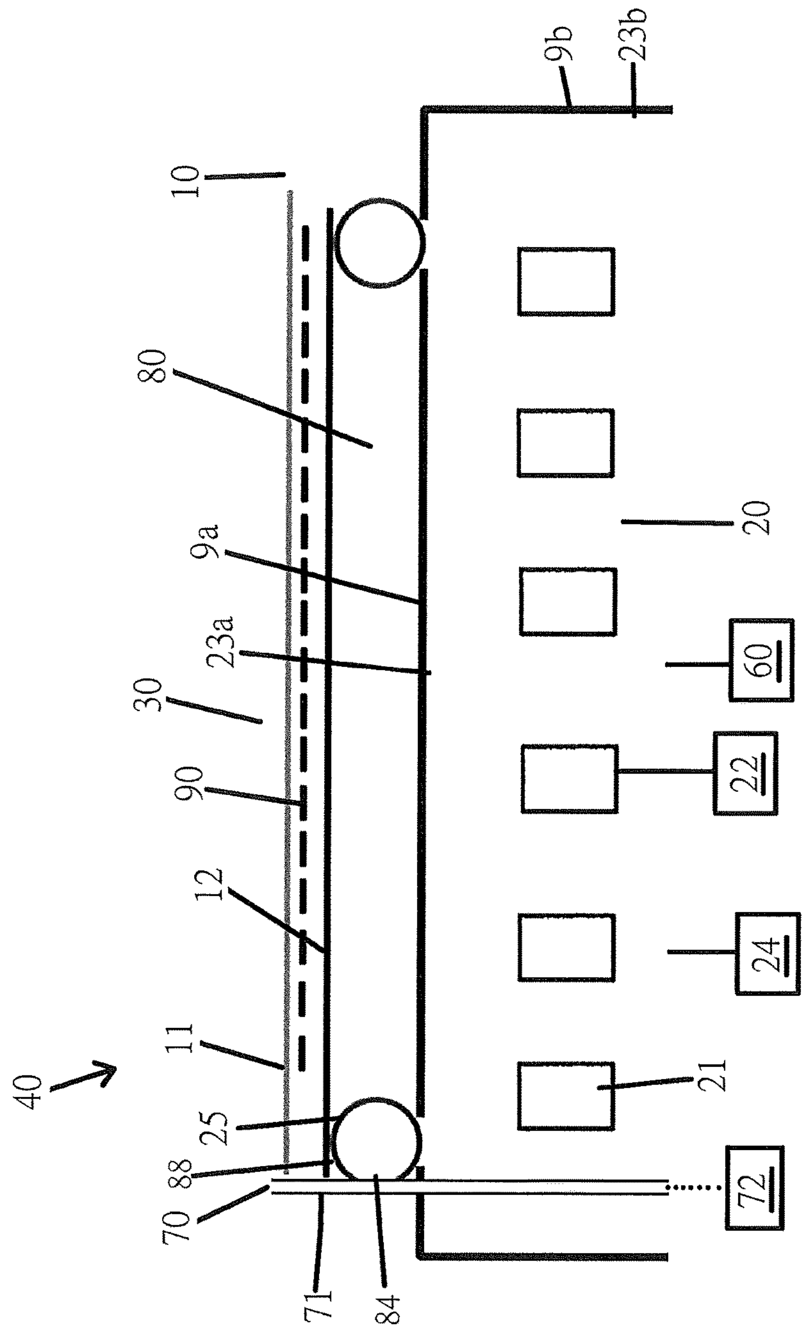
FIG. 1 is a schematic of an ESC assembly according to embodiments disclosed herein.

Disclosed herein are embodiments of an electrostatic chuck (ESC) assembly of a semiconductor substrate (substrate) processing apparatus wherein RF power is uniformly delivered from a temperature controlled RF powered baseplate to at least one RF electrode through at least one annular electrically conductive gasket. The semiconductor substrate processing apparatus preferably includes a semiconductor substrate processing chamber (i.e. vacuum chamber) in which a semiconductor substrate is processed, a process gas source in fluid communication with the processing chamber adapted to supply process gas into the processing chamber, and a vacuum source adapted to exhaust process gas and byproducts of the processing from the processing chamber. The processing apparatus is preferably a plasma processing apparatus which further includes a RF energy source adapted to energize the process gas supplied into the processing chamber into a plasma state in the processing chamber. The semiconductor substrate processing apparatus also preferably includes a control system configured to control processes performed by the processing apparatus and a non-transitory computer machine-readable medium comprising program instructions for control of the processing apparatus. The processing chamber may be a plasma etching, a chemical vapor deposition chamber, a plasma enhanced chemical vapor deposition chamber, an atomic layer deposition chamber, a plasma enhanced atomic layer deposition apparatus, or the like (all of which are herein referred to as a vacuum chambers) of the semiconductor substrate processing apparatus. In the following description, numerous specific details are set forth in order to provide a thorough understanding of the present embodiments. It will be apparent, however, to one skilled in the art that the present embodiments may be practiced without some or all of these specific details. In other instances, well known process operations have not been described in detail in order not to unnecessarily obscure present embodiments disclosed herein. Additionally, as used herein, the term "about" when used with reference to numerical values refers to ±10%.

Electrostatic chuck assemblies (as used herein "ESC assemblies") are commonly used to clamp a substrate (e.g. Johnsen Rahbek effect or Coulombic effect) and provide thermal control of the substrate (i.e. semiconductor substrate) during semiconductor fabrication processes. ESC assemblies provide a clamping force to hold the substrate on a support surface thereof when voltage (DC or AC) is applied to one or more electrostatic clamping (ESC) electrodes in the ESC assembly wherein the ESC electrode can be a monopolar or bipolar ESC electrode. Upon the removal of the applied voltage, the substrate can be removed from the support surface. The ESC assembly preferably includes lift pins which are operable to lower a substrate onto the support surface of the ESC assembly before the substrate is processed, and raise the substrate from the support surface of the ESC assembly after the substrate has been processed. An exemplary embodiment of an ESC assembly including lift pins which are operable to lower and raise a substrate can be found in commonly-assigned U.S. Pat. No. 6,567,258 which is incorporated by reference herein in its entirety.

While the substrate is clamped on the support surface of the ESC assembly, small spaces/gaps between the substrate and the ESC support surface are preferably filled with helium (usually at pressures between 1-100 Torr) to provide an improved heat transfer coefficient relative to just physical contact between the substrate and the ESC.

FIG. 1 shows an electrostatic chuck (ESC) assembly 40 which is coupled to a control system 24 which is operable to control processes performed by the ESC assembly 40 such as raising and lowering lift pins (not shown) included therein and temperature control of a semiconductor substrate supported on a support surface (e.g. mesa pattern) 30 of a layer of ceramic material 10 of the ESC assembly 40. At least one outlet (i.e. gas opening) 70 in the support surface 30 can deliver a heat transfer gas to an underside of a semiconductor substrate supported on the support surface 30. At least one gas passage 71 in the layer of ceramic material 10 is connected to a source of heat transfer gas 72 which is operable to supply heat transfer gas at a desired pressure to the at least one gas passage 71 such that the heat transfer gas can be delivered to the backside of a substrate supported on the support surface 30 of the layer of ceramic material 10 through the at least one outlet 70.

The layer of ceramic material 10 can include an ESC electrode 11 operable to clamp a semiconductor substrate on the support surface 30 thereof and at least one RF electrode 12 below the ESC electrode 11. Preferably, the ESC electrode 11 and the at least one RF electrode 12 are planar or substantially planar wherein the ESC electrode 11 and the at least one RF electrode 12 are parallel to an upper plane of the support surface 30. An exemplary embodiment of an ESC assembly including an ESC electrode and at least one RF electrode below the ESC electrode 11 can be found in commonly-assigned U.S. Pat. No. 6,483,690 which is incorporated by reference herein in its entirety.

The upper ESC electrode 11 can include a pattern of an electrically conductive material and can be a bipolar or monopolar ESC electrode. In an embodiment, the support surface 30 can have a 0.5-10 mm outer annular edge seal at an outer periphery thereof such that a clamped substrate is able to sustain up to about a 100 Torr pressure difference between the substrate backside and the pressure in the vacuum chamber of the semiconductor substrate processing apparatus. In an embodiment, the outer annular edge seal of the support surface 30 may be less than about 0.5 mm. Thus, the pressure of the heat transfer gas supplied to the backside of the substrate can be maintained, thereby enhancing thermal conductivity between the ESC assembly 40 and a substrate. Additionally, the support surface 30 can include a mesa pattern including a plurality of mesas such that the contact area between the substrate and the support surface 30 can be reduced.

The temperature controlled RF powered baseplate 20 can include fluid passages 21 therein such that temperature of the RF powered baseplate 20 can be controlled by connecting the RF powered baseplate 20 to a temperature control unit 22 that circulates temperature controlled fluid through the fluid passages 21. The temperature control unit 22 can also control the temperature of the temperature controlled fluid circulated through the fluid passages 21 to uniformly control temperature across the RF powered baseplate 20, or the fluid passages 21 can be arranged in a plurality of zones for independent control of temperature in each zone.

The layer of ceramic material 10 of the ESC assembly 40 is bonded onto the temperature controlled RF powered baseplate 20 by a bond layer 80. The bond layer 80 is preferably an elastomeric material. The elastomeric bond material forming the bond layer 80 can be applied to the RF powered baseplate 20 in liquid form and cured in-situ to form the bond layer 80 between the layer of ceramic material 10 and the RF powered baseplate 20, or alternatively, the elastomer bond material forming the bond layer 80 can be a pre-cured or partially cured sheet of material. The thermal resistance of the bond layer 80 between the layer of ceramic material 10 and the RF powered baseplate 20 can be selected such that temperature difference between the layer of ceramic material 10 and the RF powered baseplate 20 can be between 2° C. and 150° C. at about 10 W/cm$^2$ heat flux into a substrate supported on the support surface 30. Additionally, independently controlled heaters 90 can be embedded in the layer of ceramic material 10 to form independently controllable heater zones to independently control and tune the spatial and temporal temperature of the support surface 30 of ESC assembly 40 as well as the spatial and temporal temperature of a semiconductor substrate supported on the support surface 30.

The temperature controlled RF powered baseplate 20 can be electrically coupled to an RF energy source 60 operable to supply RF power to the RF powered baseplate 20. The RF energy is transferred from the RF powered baseplate 20 to the at least one RF electrode 12 included in the layer of ceramic material 10 wherein each RF electrode 12 is preferably formed by a pattern of electrically conductive material. The RF electrode 12 can be disc-shaped or annularly shaped.

In ESC assemblies wherein RF power is capacitively coupled between an RF powered baseplate and an RF electrode included in the layer of ceramic material, an RF voltage difference exists between the RF powered baseplate and the RF electrode. The RF voltage difference between the RF powered baseplate and the RF electrode can increase an RF voltage difference between a substrate supported on the layer of ceramic material and the RF powered baseplate wherein the RF voltage difference between the substrate and the RF powered baseplate can cause arcing to occur therebetween thereby damaging the ESC assembly. Providing a direct electrical connection between the RF powered baseplate and the RF electrode will cause the RF powered baseplate and the RF electrode to be at about the same voltage, which can reduce the likelihood of arcing between a substrate supported on the layer of ceramic material and the RF powered baseplate. However, in ESC assemblies wherein the RF electrode is supplied RF power from the temperature controlled RF powered baseplate at a single point, or at a couple of small area electrical contact points, non-uniform RF power can be supplied to the RF electrode, which thereby forms non-uniform plasma above an upper surface of a semiconductor substrate. Further, when discrete electrical connections are formed between the RF electrode and the RF powered baseplate, non-uniform heating can occur at the points of electrical connection which can reduce uniformity during substrate processing. Additionally the discrete electrical connections can cause heating at the respective connections to temperatures above allowable tolerances which can damage an ESC assembly.

Therefore, RF power can be uniformly delivered from the temperature controlled RF powered baseplate 20 to at least one RF electrode 12 by at least one annular electrically conductive gasket 25 that extends through the bond layer 80 and electrically couples an upper surface 23*a* of the temperature controlled RF powered baseplate 20 to the RF electrode 12 which is embedded in the layer of ceramic material 10 of the ESC assembly 40. As used herein, "annular" refers to a continuous or discontinuous ring. The at least one annular electrically conductive gasket 25 is preferably a continuous ring and extending along an outer portion of the upper surface 23*a* of the RF powered baseplate 20 near the outer circumference of the RF powered baseplate 20 so as to uniformly deliver RF power from the RF powered baseplate 20 to the at least one RF electrode 12 such that azimuthal non-uniformity of RF power can be reduced. In an embodiment, the at least one annular electrically conductive gasket 25 can be a spiral gasket which is ring shaped. In embodiments, the at least one annular electrically conductive gasket 25 can have a hollow body or alternatively a solid body. In an embodiment, the at least one annular electrically conductive gasket 25 can be segmented. If the at least one annular electrically conductive gasket 25 is segmented, then preferably portions of the at least one annular electrically conductive gasket 25 are removed such that removed portions 84 of the annular electrically conductive gasket 25 are arranged so as to be symmetrically spaced along the annular electrically conductive gasket 25 such that RF power is delivered uniformly from the RF powered baseplate 20 to the RF electrode 12, and further so that the annular electrically conductive gasket 25 will not cause non-uniform heating (i.e. nonsymmetrical heating) along the circumference thereof. Further, if the at least one annular electrically conductive gasket 25 includes the removed portions 84 (i.e. is segmented), preferably less than about 90% of the volume of the annular electrically conductive gasket 25 is removed such that the volume of the remaining annular electrically conductive gasket 25 is great enough to avoid being heated above an allowable tolerance while the annular electrically conductive gasket 25 uniformly delivers RF power from the RF powered baseplate 20 to the RF electrode 12. The removed portions 84 can be removed from the annular electrically conductive gasket 25 to provide room for other features included in the ESC assembly 40. For example, portions of the annular electrically conductive gasket 25 can be removed so as not to obstruct a gas passage of the at least one gas passage 71.

A lower surface of the layer of ceramic material 10 preferably includes at least one circumferentially extending channel 88 therein wherein an upper portion of each of the at least one annular electrically conductive gaskets 25 is disposed in a respective channel 88 of the at least one channel 88. In an alternate embodiment (see FIG. 5), the lower surface of the layer of ceramic material 10 can include an outer peripheral step 118 extending around an outer periphery of the lower surface of the layer of ceramic material 10 wherein an upper portion of an annular electrically conductive gasket 25 is disposed in the outer peripheral step 118.

Preferably, the temperature controlled RF powered baseplate 20 includes an upper layer of dielectric insulating material 9*a* on the upper surface 23*a* thereof which is adapted to reduce arcing between the semiconductor substrate supported on the support surface 30 of the layer of ceramic material 10 and the RF powered baseplate 20. The RF powered baseplate 20 can also include an outer layer of dielectric insulating material 9*b* on an outer surface 23*b* which is adapted to reduce arcing between the semiconductor substrate supported on the support surface 30 of the layer of ceramic material 10 and the RF powered baseplate 20. The dielectric insulating material 9*a*, 9*b* can be formed by anodizing the upper surface 23*a* and/or the outer surface 23*b* of the RF powered baseplate 20 or by spraying a coating of dielectric insulating material on the on the upper surface 23*a* and/or the outer surface 23*b* of the RF powered baseplate 20. For example, a thermal spray coating of $Al_2O_3$ can be sprayed on the upper surface 23*a* and/or outer surface 23*b*. Preferably regions of the upper surface 23*a* of the RF powered baseplate 20 which contact the annular electrically conductive gasket 25 do not include the dielectric insulating material 9*a*.

Figure 2:
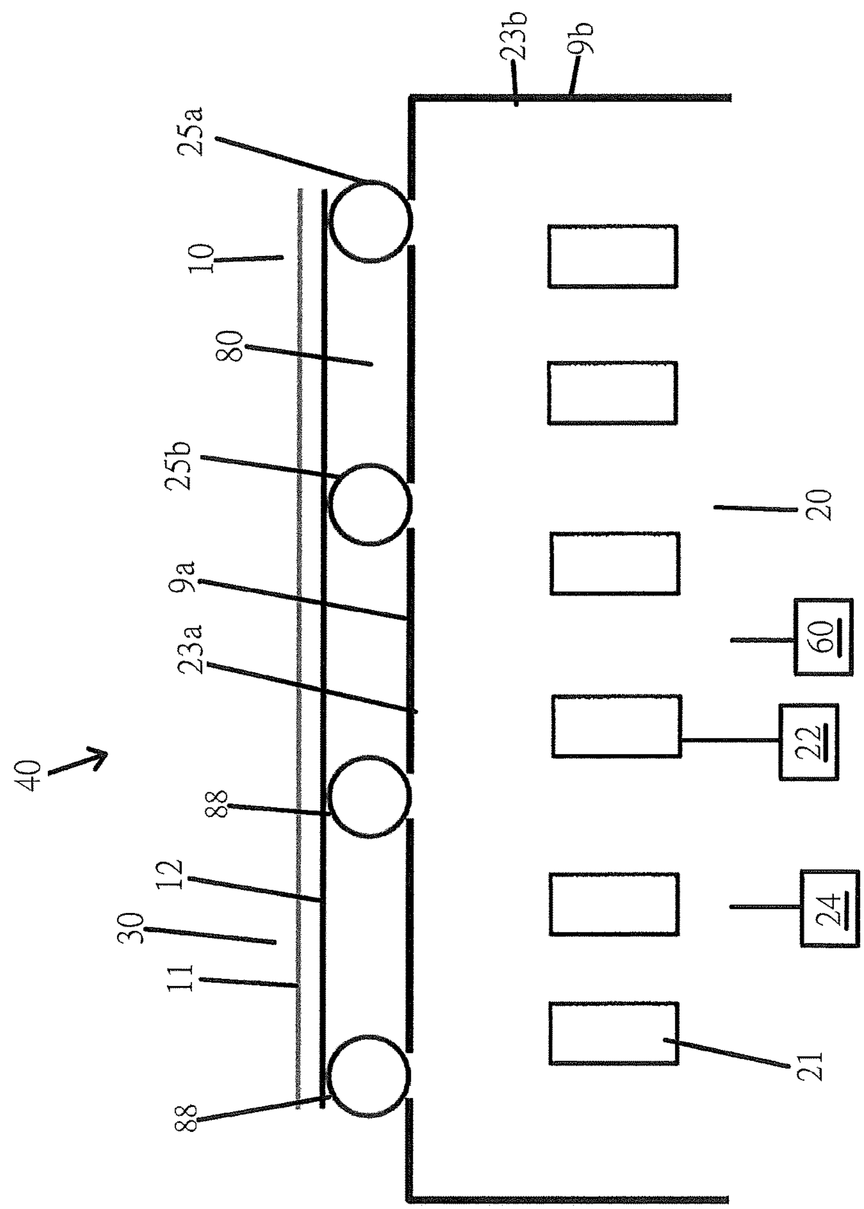
FIG. 2 is a schematic of an ESC assembly according to embodiments disclosed herein.
Figure 3:
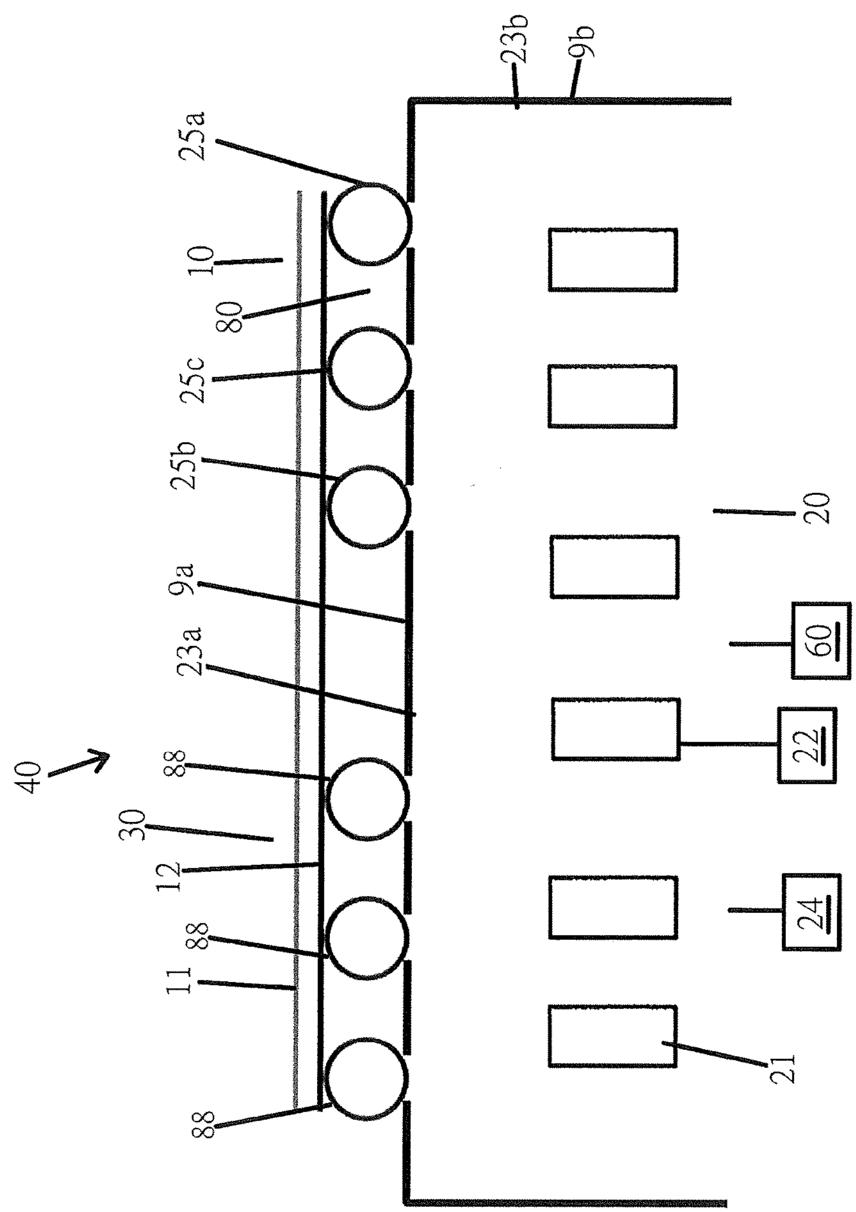
FIG. 3 is a schematic of an ESC assembly according to embodiments disclosed herein.

In an embodiment, as illustrated in FIG. 2, the at least one annular electrically conductive gasket 25 can include an outer annular electrically conductive gasket 25*a* and an inner annular electrically conductive gasket 25*b* disposed radially inward of the outer annular electrically conductive gasket 25*a* wherein the outer and inner annular electrically conductive gaskets 25*a*, 25*b* electrically couple the upper surface 23*a* of the temperature controlled RF powered baseplate 20 to the RF electrode 12. In a further embodiment, one or more intermediate annular electrically conductive gaskets can be disposed between the outer annular electrically conductive gasket 25*a* and the inner annular electrically conductive gasket 25*b*. For example, as illustrate in FIG. 3, an intermediate annular electrically conductive gasket 25*c* can be disposed between the outer annular electrically conductive gasket 25*a* and the inner annular electrically conductive gasket 25*b* wherein the outer, inner, and intermediate annular electrically conductive gaskets 25*a*, 25*b*, 25*c* electrically couple the upper surface 23*a* of the temperature controlled RF powered baseplate 20 to the RF electrode 12. By using multiple annular electrically conductive gaskets RF power can be uniformly delivered from the RF powered baseplate 20 to the RF electrode 12. Further, non-uniform heating of the ESC assembly 40 can be reduced by using more than one annular electrically conductive gasket.

Figure 4:
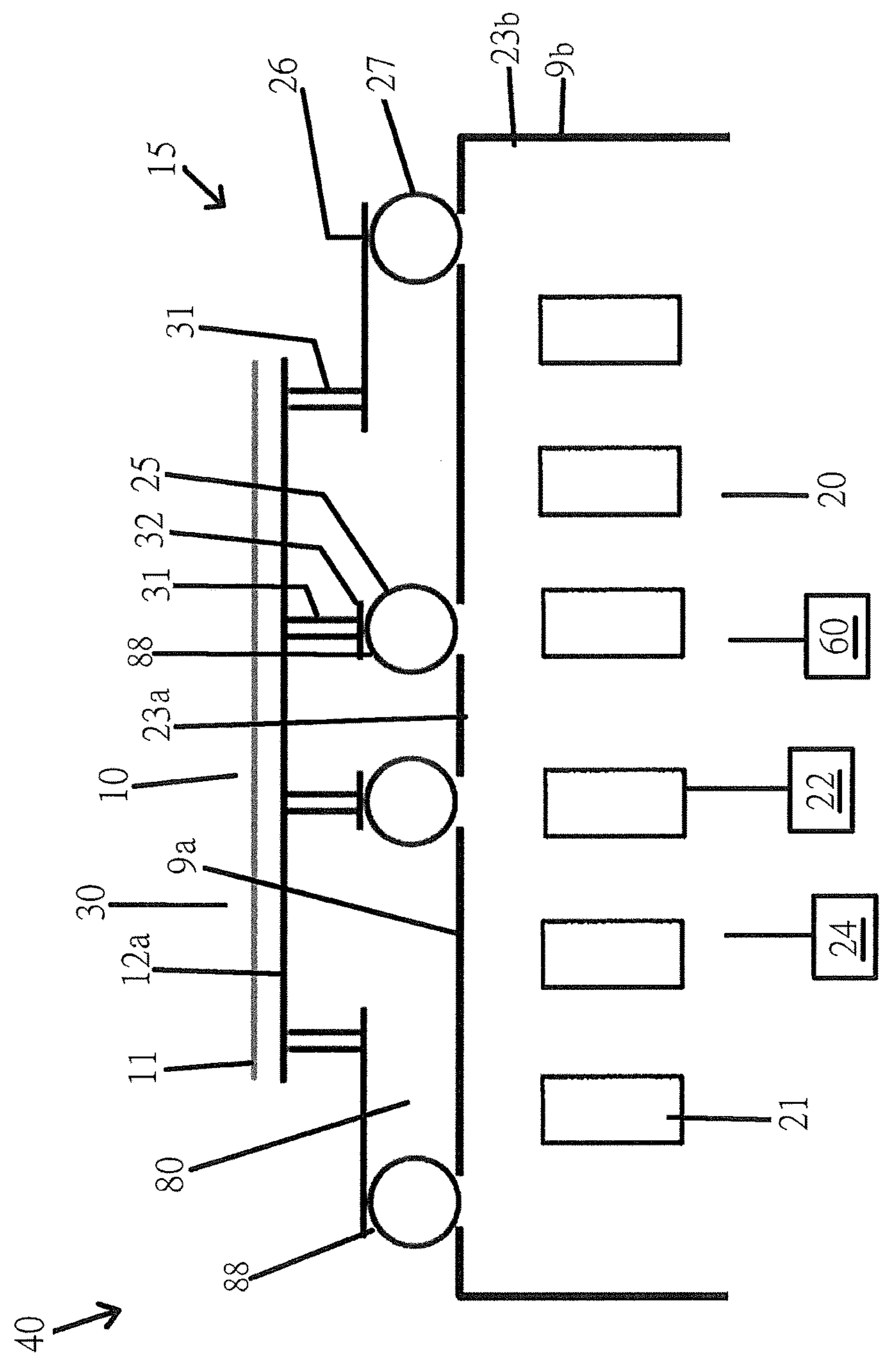
FIG. 4 is a schematic of an ESC assembly according to embodiments disclosed herein.

In an embodiment, as illustrated in FIG. 4, the layer of ceramic material 10 of the ESC assembly 40 can include a lower step 15 around an outer periphery of the upper surface thereof. Preferably, the at least one RF electrode 12 comprises an inner RF electrode 12*a* below the ESC electrode 11 and an outer annular RF electrode 26 underlying the lower step 15. The inner RF electrode 12*a* can be electrically coupled to the upper surface 23 of the RF powered baseplate 20 through a first annular electrically conductive gasket 25. The outer annular RF electrode 26 can be electrically coupled to the upper surface 23*a* of the RF powered baseplate 20 through a second outer annular electrically conductive gasket 27. In an embodiment, a plurality of vertical electrically conductive vias 31 electrically couple the outer annular RF electrode 26 to the inner RF electrode 12*a*. In a further embodiment, a plurality of vertical electrically conductive vias can electrically connect the outer annular RF electrode 26 to the outer annular electrically conductive gasket 27 wherein an optional annular electrical contact can be formed between the vertical electrically conductive vias and the outer annular RF electrode 26. Additionally, portions of the outer annular electrically conductive gasket 27 can be removed (e.g. to form a segmented outer annular electrically conductive gasket 27) so as not to obstruct other features included in the ESC assembly 40 such as a gas passage.

In an embodiment, a plurality of vertical electrically conductive vias 31, formed as vertical lines of electrically conductive material, included in the layer of ceramic material 10 can electrically connect the at least one RF electrode 12 to the at least one annular electrically conductive gasket 25. Preferably at least 100 vertical electrically conductive vias electrically connect the RF electrode 12 to the annular electrically conductive gasket. More preferably, at least 100, at least 200, at least 500, or at least 1000 vertical electrically conductive vias 31 electrically connect each annular electrically conductive gasket 25 to the at least one RF electrode 12. For example, in an embodiment, up to about 1000 or more vertical electrically conductive vias 31 arranged in an annular formation can electrically connect each annular electrically conductive gasket to the RF electrode. By using more than 100, and preferably more than 200, vertical electrically conductive vias 31, the heating problems associated with discrete electrical connections having a small area can be reduced or avoided. The plurality of vertical electrically conductive vias 31 are annularly arranged so as to correspond to the underlying shape of the annular electrically conductive gasket 25 disposed therebelow. In an embodiment, the layer of ceramic material 10 can include an annular electrical contact 32 disposed below the plurality of vertical electrically conductive vias 31 wherein the vertical electrically conductive vias 31 electrically connect the RF electrode 25 to the annular electrical contact 32 and wherein the annular electrical contact 32 is in electrical communication with the annular electrically conductive gasket 25. Preferably the annular electrical contact 32 is shaped so as to correspond to the shape of the annular electrically conductive gasket 25. The annular electrical contact 32 can form a flat surface which provides a better electrical connection between the plurality of vertical electrically conductive vias 31 and the annular electrically conductive gasket 25.

A lower surface of the layer of ceramic material 10 preferably includes at least one channel 88 therein wherein upper portions of respective ones of the at least one electrically conductive gaskets 25 are disposed in respective channels 88. Preferably, each channel 88 is arranged such that a lower surface of the at least one RF electrode 12, lower surfaces of the plurality of vertical electrically conductive vias 31, or lower surfaces of the annular electrical contacts 32 are exposed therein such that a respective electrical connection can be formed with the at least one electrically conductive gasket 25.

In an embodiment, the at least one annular electrically conductive gasket 25 can be a band of electrically conductive material which has a circular cross section (see FIG. 4) or a rectangular cross section. In an embodiment, the at least one electrically conductive gasket 25 can be separately formed and then installed in the ESC assembly 40 during construction of the ESC assembly 40. In this embodiment, the at least one electrically conductive gasket 25 can be, for example, an electrically conductive spiral gasket or an electrically conductive O-ring which is disposed between the layer of ceramic material 10 and the RF powered baseplate 20 and electrically couples the upper surface of the temperature controlled RF powered baseplate 20 to the at least one RF electrode 12 included in the layer of ceramic material 10. Alternatively, the at least one electrically conductive gasket 25 can be formed during construction of the ESC assembly 40 wherein the at least one RF gasket 25 can be an electrically conductive epoxy or an electrically conductive adhesive which is applied to a groove surrounding the bond layer 80 between the layer of ceramic material 10 and the RF powered baseplate 20. The electrically conductive epoxy or the electrically conductive adhesive is cured in-situ to form an electrically conductive gasket 25 (e.g., a band of electrically conductive material) wherein the electrically conductive gasket 25 couples the upper surface of the temperature controlled RF powered baseplate 20 to the at least one RF electrode 12 included in the layer of ceramic material 10.

Figure 5:
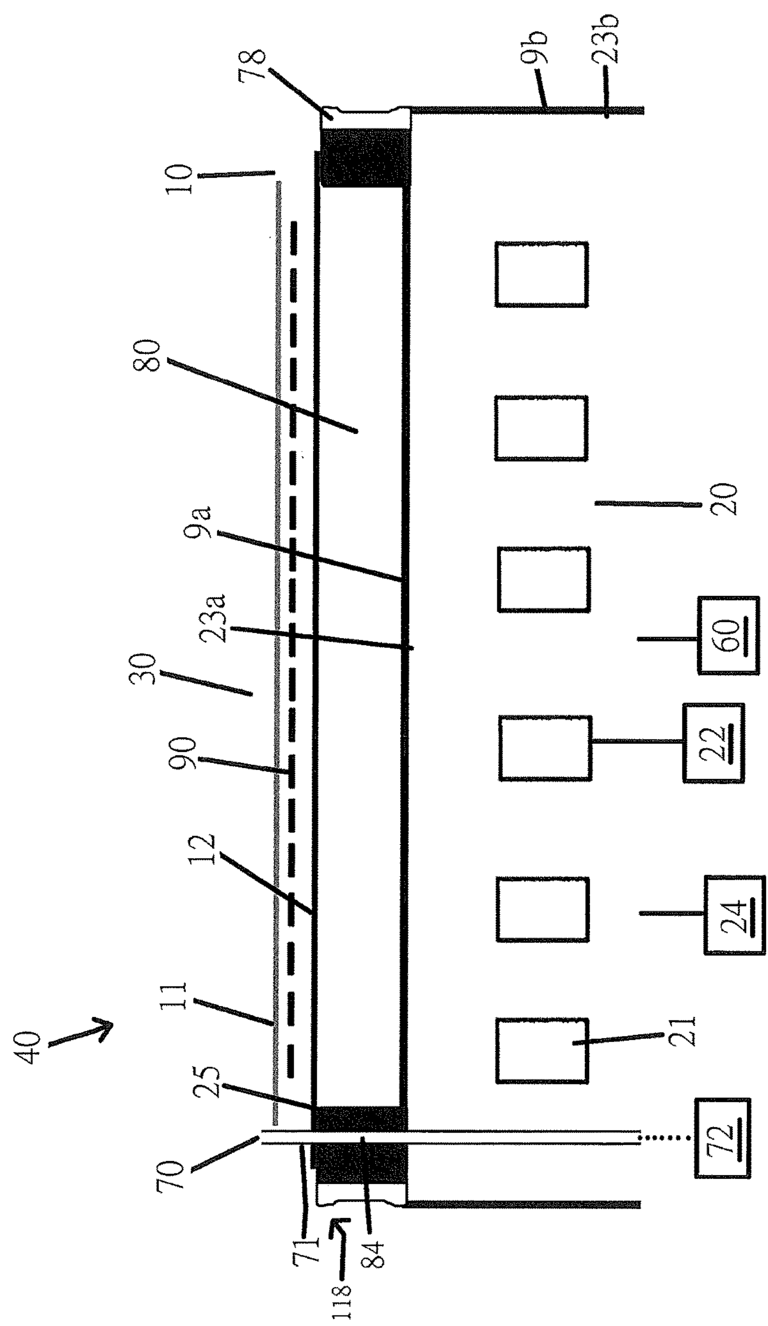
FIG. 5 is a schematic of an ESC assembly according to embodiments disclosed herein.

For example, as illustrated in FIG. 5, the band of electrically conductive material forming the annular electrically conductive gasket 25 has a rectangular cross section and extends around the bond layer 80 wherein an outer perimeter of the annular electrically conductive gasket 25 is radially located within about 10 mm of an outer perimeter of the layer of ceramic material 10 (i.e. the outer radius of the annular electrically gasket 25 can be about 10 mm or less than the outer radius of the layer of ceramic material 10). In an embodiment, a protective O-ring 78, such as an elastomer O-ring or a Teflon (PTFE—PolyTetraFluoroEthylene, manufactured by DuPont) encapsulated elastomer O-ring, can surround the annular electrically conductive gasket 25 so as to protect the annular electrically conductive gasket 25 from plasma and/or reactive gases during semiconductor substrate processing. In an embodiment, the protective O-ring 78 can have a rectangular or nearly rectangular cross section wherein the protective O-ring 78 can include convex surfaces along the longest dimension of the rectangular or nearly rectangular cross section. An exemplary embodiment of a protective O-ring (i.e. an edge seal) can be found in commonly-assigned U.S. Patent Application No. 2013/0340942, which is hereby incorporated by reference herein in its entirety.

The band of electrically conductive material forming the annular electrically conductive gasket 25 can bond the RF powered baseplate 20 to the layer of ceramic material 10 and electrically couple the upper surface of the temperature controlled RF powered baseplate 20 to the RF electrode 12. In this embodiment, the material forming the annular electrically conductive gasket 25 can be an electrically conductive epoxy adhesive or an electrically conductive silicone adhesive which is cured in-situ in a groove between the RF powered baseplate 20 and the layer of ceramic material 10 surrounding the bond layer 80. In an embodiment, the electrically conductive epoxy adhesive or the electrically conductive silicone adhesive can include an electrically conductive filler such as, for example, a silver filler. In a further embodiment, a plurality of vertical electrically conductive vias (not shown) can electrically connect the RF electrode 12 to the band of electrically conductive material forming the annular electrically conductive gasket 25. In this embodiment, the outer peripheral step 118 can optionally be excluded from the lower surface of the layer of ceramic material 10.

To make the ESC assembly, according to embodiments disclosed herein, a layer of ceramic material having an upper electrostatic clamping (ESC) electrode and at least one RF electrode embedded therein is formed by arranging layers of green ceramic material with the upper ESC electrode and the at least one RF electrode therebetween. The layers of green ceramic material including the upper ESC electrode and the at least one RF electrode therebetween are fired to form the layer of ceramic material. The layer of ceramic material is bonded to an upper surface of a temperature controlled RF powered baseplate wherein at least one annular electrically conductive gasket electrically couples the RF powered baseplate to the RF electrode. In an embodiment, the upper ESC electrode and the at least one RF electrode can each be formed by screen printing a metal paste on a respective layer of the green ceramic material.

In an embodiment, holes can be punched in the arranged layers of the green ceramic material before firing. The holes can be filled with a metal paste to form a plurality of vertical electrically conductive vias adapted to electrically connect the at least one RF electrode to at least one annular electrically conductive gasket included between the RF powered base plate and the layer of ceramic material. Further, an annular electrical contact can be formed at the lower ends of the plurality of vertical electrically conductive vias wherein the vertical electrically conductive vias and the annular electrical contact are adapted to electrically connect the at least one RF electrode to the at least one annular electrically conductive gasket. In an embodiment an upper surface and/or an outer surface of the RF powered baseplate can be coated with a dielectric insulating material by anodizing the respective surfaces or thermal spray coating the respective surfaces with $Al_2O_3$ wherein regions of the upper surface of the RF powered baseplate adapted to electrically connect to the annular electrically conductive gasket are not coated.

During processing operations, such as plasma processing, process gas from a process gas source is supplied into a processing chamber (i.e. vacuum chamber) wherein the process gas is generated into plasma by supplying RF energy into the processing chamber such that the substrate may then be processed by a plasma etching or a plasma enhanced deposition process. A vacuum source evacuates the chamber of processing gas and process by-products. While processing the semiconductor substrate in the vacuum chamber, RF power is uniformly delivered from the RF powered baseplate to the RF electrode and/or an outer annular RF electrode through an annular electrically conductive gasket.

While the invention has been described in detail with reference to specific embodiments thereof, it will be apparent to those skilled in the art that various changes and modifications can be made, and equivalents employed, without departing from the scope of the appended claims.

What is claimed is:

1. A processing apparatus for processing a semiconductor substrate, the processing apparatus comprising:
- a processing chamber in which the semiconductor substrate is processed;
- a process gas source in fluid communication with the processing chamber and adapted to supply process gas into the processing chamber;
- a RF energy source adapted to energize the process gas into a plasma state in the processing chamber;
- a vacuum source adapted to exhaust process gas and byproducts from the processing chamber during the processing of the semiconductor substrates; and
- an electrostatic chuck assembly comprising
  - a layer of ceramic material including an electrostatic clamping (ESC) electrode and at least one RF electrode below the ESC electrode, wherein the at least one RF electrode and the ESC electrode are embedded in the layer of ceramic material,
  - a temperature controlled RF powered baseplate,
  - a bond layer disposed between the layer of ceramic material and the temperature controlled RF powered baseplate, wherein the bond layer bonds the temperature controlled RF powered baseplate to the layer of ceramic material, and
  - at least one annular electrically conductive gasket extending along an upper surface of the temperature controlled RF powered baseplate and through the bond layer, wherein the at least one annular electrically conductive gasket electrically couples the upper surface of the temperature controlled RF powered baseplate to the RF electrode, wherein the layer of ceramic material includes a support surface adapted to electrostatically clamp a semiconductor substrate during processing of the semiconductor substrate, and
- wherein RF power is provided from the temperature controlled RF powered baseplate to the at least one RF electrode by the at least one annular electrically conductive gasket.

2. The processing apparatus of claim 1, wherein:
- the at least one annular electrically conductive gasket comprises an outer annular electrically conductive gasket and an inner annular electrically conductive gasket both of which extend in the bond layer; and
- the inner annular electrically conductive gasket is disposed radially inward of the outer annular electrically conductive gasket.

3. The processing apparatus of claim 2, wherein the inner annular electrically conductive gasket and the outer annular electrically conductive gasket are disposed in the bond layer and between the temperature controlled RF powered baseplate and the layer of ceramic material.

4. The processing apparatus of claim 2, wherein the at least one annular electrically conductive gasket comprises one or more intermediate annular electrically conductive gaskets disposed between the outer annular electrically conductive gasket and the inner annular electrically conductive gasket.

5. The processing apparatus of claim 1, wherein the layer of ceramic material includes a stepped portion extending along a circumference of the layer of ceramic material.

6. The processing apparatus of claim 5, wherein the at least one RF electrode comprises:
- an inner RF electrode disposed below the ESC electrode and electrically coupled to the upper surface of the temperature controlled RF powered baseplate by a first annular electrically conductive gasket; and
- an outer annular RF electrode disposed underneath the stepped portion and electrically coupled to the upper surface of the temperature controlled RF powered baseplate by a second outer annular electrically conductive gasket.

7. The processing apparatus of claim 6, wherein:
- the inner RF electrode is electrically coupled to the upper surface of the temperature controlled RF powered baseplate by a first plurality of vertical electrically conductive vias; and
- a second plurality of vertical electrically conductive vias electrically couple the outer annular RF electrode to the inner RF electrode.

8. The processing apparatus of claim 1, wherein:
- the layer of ceramic material includes a plurality of vertical electrically conductive vias; and
- the vertical electrically conductive vias electrically connect the at least one RF electrode to the at least one annular electrically conductive gasket or an annular electrical contact in the layer of ceramic material.

9. The processing apparatus of claim 1, wherein the at least one annular electrically conductive gasket is a spiral gasket.

10. The processing apparatus of claim 1, wherein:
- (a) the electrostatic chuck assembly further comprises
  - at least one outlet in the support surface, which delivers a heat transfer gas to an underside of the semiconductor substrate, and at least one gas passage in the layer of ceramic material connected to a source of the heat transfer gas and operable to supply the heat transfer gas at a predetermined pressure to the at least one gas passage;

(b) the bond layer is formed by an elastomeric material;

(c) the electrostatic chuck assembly further comprises lift pins operable to lower the semiconductor substrate onto the support surface of the electrostatic chuck assembly and to raise the semiconductor substrate from the support surface of the electrostatic chuck assembly;

(d) the ESC electrode is a monopolar or bipolar ESC electrode;

(e) the layer of ceramic material includes a plurality independently controlled heaters operable to heat independently controllable zones;

(f) the at least one annular electrically conductive gasket comprises a segmented gasket;

(g) the ESC electrode includes a pattern of an electrically conductive material;

(h) the at least one RF electrode includes a pattern of an electrically conductive material;

(i) a lower surface of the layer of ceramic material includes at least one circumferentially extending channel;

(j) an upper portion of each of the at least one annular electrically conductive gasket is disposed in a respective channel of the at least one circumferentially extending channel;

(k) the lower surface of the layer of ceramic material includes an outer peripheral step;

(l) the outer peripheral step extends around an outer periphery of the lower surface of the layer of ceramic material; and (m) an upper portion of an annular electrically conductive gasket of the at least one annular electrically conductive gasket is disposed in the outer peripheral step.

11. The processing apparatus of claim 1, further comprising:

a control system configured to control processes performed by the processing apparatus; and a non-transitory computer machine-readable medium comprising program instructions for controlling the processing apparatus.

12. The processing apparatus of claim 1, wherein:

the temperature controlled RF powered baseplate includes an upper layer of dielectric insulating material and an outer layer of dielectric insulating material;

the dielectric insulating material is disposed on the upper surface of the temperature controlled RF powered baseplate and is adapted to reduce arcing between the semiconductor substrate and the temperature controlled RF powered baseplate; and the outer layer of dielectric insulating material is disposed on an outer surface of the temperature controlled RF powered baseplate and is adapted to reduce arcing between the semiconductor substrate and the temperature controlled RF powered baseplate, wherein regions of the upper surface of the temperature controlled RF powered baseplate which contact the at least one annular electrically conductive gasket do not include the dielectric insulating material.

13. A method of processing the semiconductor substrate in the processing apparatus of claim 1, the method comprising:

supporting the semiconductor substrate on the support surface of the electrostatic chuck assembly;

supplying the process gas from the process gas source into the processing chamber;

energizing the process gas into a plasma state in the processing chamber; and processing the semiconductor substrate in the processing chamber.

14. The method of claim 13, wherein the processing of the semiconductor substrate comprises plasma etching the semiconductor substrate or performing a deposition process on the semiconductor substrate.

15. The processing apparatus of claim 1, wherein the bond layer extends over and is in contact with an upper most surface of the temperature controlled RF powered baseplate and separates the temperature controlled RF powered baseplate from the layer of ceramic material.

16. The processing apparatus of claim 1, wherein the at least one annular electrically conductive gasket is disposed between and is in contact with the temperature controlled RF powered baseplate and the layer of ceramic material.

17. The processing apparatus of claim 1, wherein the bond layer is in contact with the temperature controlled RF powered baseplate and the layer of ceramic material.

18. The processing apparatus of claim 1, wherein the at least one annular electrically conductive gasket is formed by a band of electrically conductive material having an outer radius equal to an outer radius of the layer of ceramic material.

19. The processing apparatus of claim 1, further comprising an O-ring, wherein:

the at least one annular electrically conductive gasket is formed by a band of electrically conductive material having an outer radius that is 10 mm or less than an outer radius of the layer of ceramic material; and the O-ring surrounds the band of electrically conductive material.

20. The processing apparatus of claim 1, wherein:

the at least one annular electrically conductive gasket is formed from an electrically conductive epoxy adhesive or an electrically conductive silicone adhesive; and the at least one annular electrically conductive gasket bonds the temperature controlled RF powered baseplate to the layer of ceramic material.

21. The processing apparatus of claim 1, wherein the annular electrically conductive gasket is disposed in a channel of the bond layer.

22. The processing apparatus of claim 1, wherein the at least one electrically conductive gasket extends along an outer periphery of the bond layer.

23. The processing apparatus of claim 1, wherein the annular electrically conductive gasket contacts the RF electrode.

24. The processing apparatus of claim 1, wherein the bond layer is formed of a non-conductive elastomeric material.

25. The processing apparatus of claim 1, wherein the bond layer provides thermal separation between the layer of ceramic material and the temperature controlled RF powered baseplate, such that a temperature difference between the layer of ceramic material and the temperature controlled RF powered baseplate is up to 150° C.

26. An electrostatic chuck assembly for a semiconductor substrate processing chamber of a semiconductor substrate processing apparatus, the electrostatic chuck assembly comprising:

a first layer of ceramic material including an electrostatic clamping (ESC) electrode and at least one RF electrode disposed below the ESC electrode, wherein the at least one RF electrode and the ESC electrode are embedded in the layer of ceramic material;

a temperature controlled RF powered baseplate;

a bond layer disposed between the first layer of ceramic material and the temperature controlled RF powered baseplate, wherein the bond layer bonds the temperature controlled RF powered baseplate to the first layer of ceramic material; and at least one annular electrically conductive gasket extending along an upper surface of the temperature controlled RF powered baseplate and through the bond layer, wherein the at least one annular electrically conductive gasket electrically couples the upper surface of the temperature controlled RF powered baseplate to the at least one RF electrode, wherein RF power is provided from the temperature controlled RF powered baseplate to the at least one RF electrode by the at least one annular electrically conductive gasket, and wherein the first layer of ceramic material includes a support surface adapted to electrostatically clamp a semiconductor substrate during processing of the semiconductor substrate.

27. The electrostatic chuck assembly of claim 26, wherein:

the at least one annular electrically conductive gasket comprises an outer annular electrically conductive gasket and an inner annular electrically conductive gasket both of which extend in the bond layer; and the inner annular electrically conductive gasket is disposed radially inward of the outer annular electrically conductive gasket.

28. The electrostatic chuck assembly of claim 26, wherein the first layer of ceramic material includes a stepped portion extending along a circumference of the first layer of ceramic material.

29. The electrostatic chuck assembly of claim 26, wherein:

the first layer of ceramic material includes a plurality of vertical electrically conductive vias; and the vertical electrically conductive vias electrically connect the at least one RF electrode to the at least one annular electrically conductive gasket or an annular electrical contact in the first layer of ceramic material.

30. The electrostatic chuck assembly of claim 26, further comprising an O-ring, wherein the at least one annular electrically conductive gasket is formed:

by a band of electrically conductive material having an outer radius that is 10 mm or less than an outer radius of the first layer of ceramic material;

wherein the O-ring surrounds the band of electrically conductive material; and from an electrically conductive epoxy adhesive or an electrically conductive silicone adhesive, wherein the at least one annular electrically conductive gasket bonds the temperature controlled RF powered baseplate to the first layer of ceramic material.

31. The electrostatic chuck assembly of claim 26, wherein:

(a) the electrostatic chuck assembly further comprises at least one outlet in the support surface which delivers a heat transfer gas to an underside of the semiconductor substrate, and at least one gas passage in the first layer of ceramic material connected to a source of the heat transfer gas and operable to supply the heat transfer gas at a predetermined pressure to the at least one gas passage;

(b) the bond layer is formed by an elastomeric material;

(c) the electrostatic chuck assembly further comprises lift pins operable to lower the semiconductor substrate onto the support surface of the electrostatic chuck assembly and to raise the semiconductor substrate from the support surface of the electrostatic chuck assembly;

(d) the ESC electrode is a monopolar or bipolar ESC electrode;

(e) the first layer of ceramic material includes a plurality of independently controlled heaters operable to heat independently controllable zones;

(f) the at least one annular electrically conductive gasket comprises a segmented gasket;

(g) the ESC electrode includes a pattern of an electrically conductive material;

(h) the at least one RF electrode includes a pattern of an electrically conductive material; and/or (i) a lower surface of the first layer of ceramic material includes at least one circumferentially extending channel;

(j) an upper portion of each of the at least one annular electrically conductive gaskets is disposed in a respective channel of the at least one circumferentially extending channel;

(k) the lower surface of the first layer of ceramic material includes an outer peripheral step;

(l) the outer peripheral step extends around an outer periphery of the lower surface of the first layer of ceramic material; and (m) an upper portion of an annular electrically conductive gasket of the at least one annular electrically conductive gasket is disposed in the outer peripheral step.

32. The electrostatic chuck assembly of claim 26, wherein:

the temperature controlled RF powered baseplate includes an upper layer of dielectric insulating material and an outer layer of dielectric insulating material;

the dielectric insulating material is disposed on the upper surface of the temperature controlled RF powered baseplate and is adapted to reduce arcing between the semiconductor substrate and the temperature controlled RF powered baseplate, wherein regions of the upper surface of the temperature controlled RF powered baseplate which contact the at least one annular electrically conductive gasket do not include the dielectric insulating material; and the outer layer of dielectric insulating material is disposed on an outer surface of the temperature controlled RF powered baseplate and is adapted to reduce arcing between the semiconductor substrate and the temperature controlled RF powered baseplate.

33. A method of manufacturing the electrostatic chuck assembly of claim 26, the method comprising:

forming the first layer of ceramic material including the ESC electrode and the at least one RF electrode by arranging the ESC electrode and the at least one RF electrode between layers of green ceramic material, and firing the layers of the green ceramic material to form the first layer of ceramic material; and bonding the first layer of ceramic material via the bond layer to the upper surface of a temperature controlled RF powered baseplate such that the at least one annular electrically conductive gasket electrically extends through the bond layer and electrically couples the upper surface of the temperature controlled RF powered baseplate to the at least one RF electrode.

34. The method of claim 33, further comprising:

punching holes in the layers of the green ceramic material before firing;

filling the punched holes with a metal paste to form a plurality of vertical electrically conductive vias, wherein the plurality of vertical electrically conductive vias are adapted to electrically connect the at least one RF electrode to the at least one annular electrically conductive gasket; and forming an annular electrical contact at ends of the plurality of vertical electrically conductive vias, wherein the plurality of vertical electrically conductive vias and the annular electrical contact are adapted to electrically connect the at least one RF electrode to the at least one annular electrically conductive gasket.

35. The method of claim 33, further comprising coating an upper surface and an outer surface of the temperature controlled RF powered baseplate with a dielectric insulating material, wherein regions of the upper surface of the temperature controlled RF powered baseplate are adapted to electrically connect to the annular electrically conductive gasket and are not coated.

* * * * *